(12) United States Patent
Tetzlaff et al.

(10) Patent No.: US 7,598,768 B1
(45) Date of Patent: Oct. 6, 2009

(54) METHOD AND APPARATUS FOR DYNAMIC PORT PROVISIONING WITHIN A PROGRAMMABLE LOGIC DEVICE

(75) Inventors: David E. Tetzlaff, Minnetonka, MN (US); Marwan M. Hassoun, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 629 days.

(21) Appl. No.: 11/198,576

(22) Filed: Aug. 5, 2005

(51) Int. Cl.
*G06F 7/38* (2006.01)
*H03K 19/173* (2006.01)

(52) U.S. Cl. .......................... 326/38; 716/16
(58) Field of Classification Search ............. 326/37–41, 326/47
See application file for complete search history.

(56) References Cited

U.S. PATENT DOCUMENTS

| | | | |
|---|---|---|---|
| 6,907,595 B2* | 6/2005 | Curd et al. .................... 716/16 |
| 7,092,689 B1* | 8/2006 | Boecker et al. ............. 455/260 |
| 7,267,751 B2* | 9/2007 | Gelbart et al. .............. 204/406 |
| 7,408,380 B1* | 8/2008 | Hassoun et al. ............... 326/38 |
| 2004/0113655 A1* | 6/2004 | Curd et al. ..................... 326/40 |
| 2005/0248364 A1* | 11/2005 | Vadi et al. ..................... 326/39 |
| 2005/0256969 A1* | 11/2005 | Yancey et al. ............... 709/238 |
| 2007/0101242 A1* | 5/2007 | Yancey et al. ............... 714/776 |

\* cited by examiner

*Primary Examiner*—Rexford N Barnie
*Assistant Examiner*—Dylan White
(74) *Attorney, Agent, or Firm*—LeRoy D. Maunu

(57) ABSTRACT

A method and apparatus to allow dynamic port provisioning of communication ports within a Programmable Logic Device (PLD). The dynamic port provisioning combines configuration of serial Input/Output (I/O) devices with simultaneous reconfiguration of a portion of programmable logic resources within the PLD and processor functions to implement a particular communication protocol. The dynamic port provisioning is facilitated for a single channel, without affecting the dynamic port provisioning of other communication channels operating within the PLD.

19 Claims, 6 Drawing Sheets

METHOD AND APPARATUS FOR DYNAMIC PORT PROVISIONING WITHIN A PROGRAMMABLE LOGIC DEVICE

FIELD OF THE INVENTION

The present invention generally relates to Programmable Logic Devices (PLDs), and more particularly to PLDs exhibiting dynamic port provisioning.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs), and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The data bits can be stored in volatile memory (e.g., static memory cells), in non-volatile memory (e.g., FLASH memory), or in any other type of memory cell. The collective states of the individual memory cells then determine the function of the FPGA.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include a floor planned layout targeted to a specific family of FPGAs. Cores can also be parameterizable, i.e., allowing the user to enter parameters to activate or change certain core functionality.

In many communication applications, for example, PLDs may be used to balance the efficiency of Application Specific Integrated Circuits (ASICs) with the flexibility of software. In such systems, the PLD off-loads the Central Processing Unit (CPU) for specific algorithms that are not efficiently handled within the CPU. Such algorithms may include serial communication protocols that may operate in conformance with the communication layers within the Open System Interconnection (OSI) definition, for example.

A PLD may also be called upon to interface to the particular physical layer that is associated with the communication protocol. Thus, two main blocks of functionality may be required to interface the PLD to the particular serial communication system. First, the physical capabilities of the PLD may need to match the physical layer attributes of the communication system, such as data rate, voltage swing, encoding, etc. Second, the PLD may need to be programmed to operate in accordance with the particular communication protocol in use, such as Synchronous Optical Network/Synchronous Digital Hierarchy (SONET/SDH) or Gigabit Ethernet as specified by IEEE 802.3.

Simultaneously configuring the MGTs, processors, and the programmable logic resources to meet the requirements of all of the communication layers, however, has not yet been combined to create dynamic port provisioning.

SUMMARY

To overcome limitations in the prior art, and to overcome other limitations that will become apparent upon reading and understanding the present specification, various embodiments of the present invention disclose an apparatus and method for dynamically configuring MGT physical layer attributes, and simultaneously, dynamically configuring the corresponding higher level protocol attributes implemented on programmable logic resources of the PLD and internal/external processors for independent port provisioning.

In accordance with one embodiment of the invention, a method of provisioning communication ports in a programmable logic device (PLD) comprises initially configuring a plurality of multi-gigabit transceivers (MGTs) and corresponding sets of configurable resources to implement one or more communication protocols. The method further comprises activating communications with the plurality of MGTs in accordance with the one or more communication protocols and deactivating one of the plurality of MGTs, where one or more MGT attribute is reconfigured relative to the initial MGT configuration. The method further comprises reconfiguring the set of configurable resources corresponding to the deactivated MGT while continuing communications with the activated MGTs.

In accordance with another embodiment of the invention, a method of activating multiple communication ports of an integrated circuit (IC) comprises configuring a multi-gigabit transceiver (MGT) and an associated set of reconfigurable logic resources associated with each communication port of the IC, establishing communications with each communication port of the IC, where each communication port is configured in accordance with a communication protocol, and reconfiguring one of the communication ports while maintaining each of the other communication ports in an active communication state.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to the field of PLDs, which combine dynamically configurable serial Input/Output ports, such as Multi-Gigabit Transceivers (MGT), with partially configurable PLD cores and internal/external processing, for dynamic port provisioning within communication systems. The various embodiments of the present invention allow the capability to determine, change, and upgrade, for example, the data transfer rate and protocol being utilized by a particular serial I/O port, while unaffecting characteristics of other ports operating within the PLD. Such a configurable communication system allows any serial I/O port to independently operate at virtually any speed with virtually any communication protocol.

In accordance with one embodiment of the present invention, the system allows MGT provisioning or upgrading with simultaneous reconfiguration of the PLD fabric and executable code for implementation of the new protocol. Such a reconfiguration is allowable for a single channel, without affecting the provisioning of the other communication channels operating within the PLD.

Figure 1:
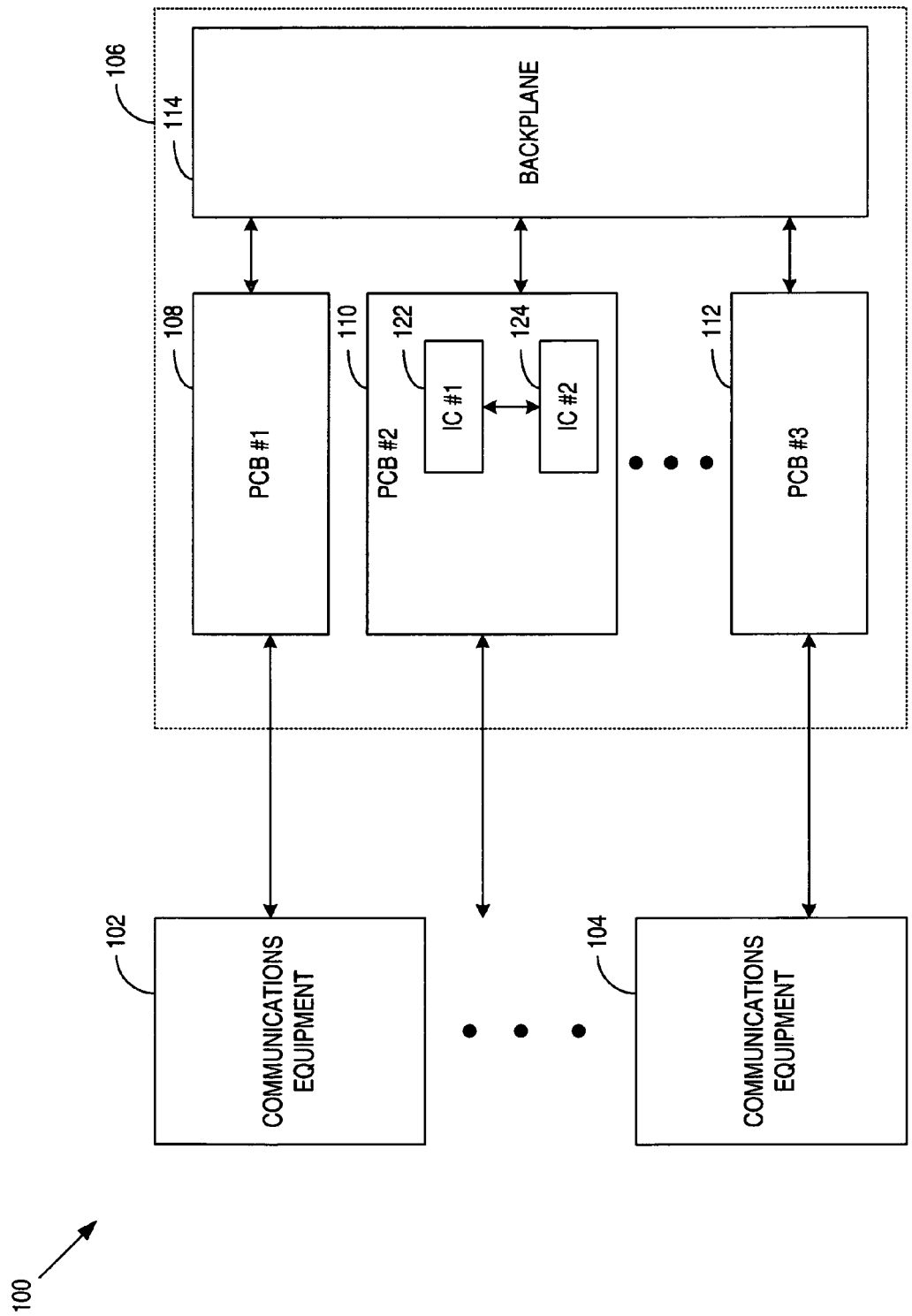
FIG. 1 illustrates an exemplary communication system.

In one embodiment, the present invention may be utilized with any communication protocol that requires serial I/O. Communication system 100 of FIG. 1, for example, is illustrated in which one embodiment of the present invention may be utilized. Communication equipment blocks 102-106 may represent communicating entities, in which communication takes place at various levels and distances using various wired and/or wireless protocols.

Communication equipment blocks 102-104, for example, may communicate with communications block 106 via a Local Area Network (LAN) or storage network using technologies such as 1 Gigabit Ethernet, or 10 Gigabit Ethernet, as specified by IEEE 802.3. Communication system 100 may designate a data center, storage network, or System Area Network (SAN), in which the Infiniband serial I/O interconnect architecture, or Fiber Channel, is utilized. Conversely, communication system 100 may represent a Synchronous Optical NETwork (SONET) or Synchronous Digital Hierarchy (SDH) employed by many Internet Service Providers (ISPs) and other high bandwidth end users.

Still other communication technologies supported by communication system 100 may include Peripheral Component Interconnect (PCI), PCI-Express, RapidIO, and Serial Advanced Technology Attachment (ATA). Such communication standards may be implemented, for example, to support communications between Printed Circuit Boards (PCBs) 108-112, Integrated Circuits 122-124, and backplane 114. As can be recognized by one of ordinary skill in the art, any number of communication standards may benefit from the various embodiments of the present invention as is discussed in more detail below.

Figure 2:
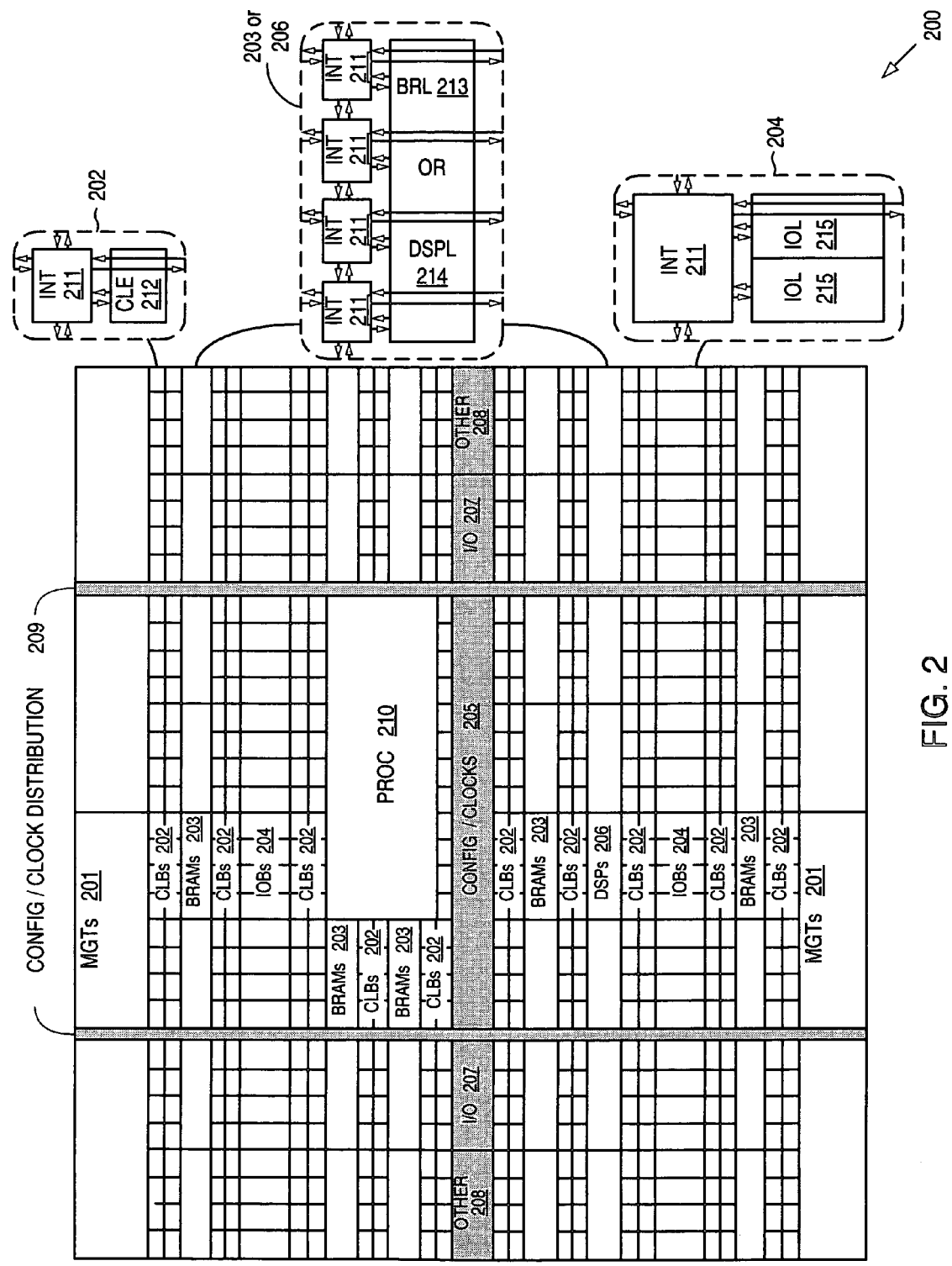
FIG. 2 illustrates an exemplary Field Programmable Gate Array (FPGA) architecture.

As noted above, advanced FPGAs can include several different types of programmable logic blocks in the array. For example, FIG. 2 illustrates an FPGA architecture 200 that includes a large number of programmable tiles including MGTs 201, CLBs 202, BRAMs 203, IOBs 204, configuration and clocking logic CONFIG/CLOCKS 205, DSPs 206, specialized I/O 207, including configuration ports and clock ports, and other programmable logic 208, such as digital clock managers, analog-to-digital converters, system monitoring logic, and so forth.

Some FPGAs also include dedicated processor blocks PROC 210, in which specific CPU related functionality may be utilized that is separate from the programmable logic resources. In accordance with one embodiment of the present invention, CPU related functionality may also be utilized to simultaneously reconfigure or provision MGT 201 functionality along with the associated programmable logic resource implementation of the corresponding serial communication protocol at the port level. CPU related functionality may also be utilized in conjunction with executable code, to implement a portion of the high layers of the communication protocol. Such dynamic reconfiguration may be accomplished at the channel level, without affecting the provisioning of adjacent channels.

In some FPGAs, each programmable tile includes a programmable interconnect element INT 211 having standardized connections to and from a corresponding interconnect element in each adjacent tile. Therefore, the programmable interconnect elements taken together implement the programmable interconnect structure for the illustrated FPGA. INT 211 also includes the connections to and from the programmable logic element within the same tile, as shown by the examples of blocks 202 and 204.

For example, a CLB 202 may include a Configurable Logic Element CLE 212 that may be programmed to implement user logic plus a single programmable interconnect element INT 211. A BRAM 203 can include a BRAM logic element (BRL 213) in addition to one or more programmable interconnect elements. Typically, the number of interconnect elements included in a tile depends on the height of the tile (as measured from right to left of FIG. 2). In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 may include, for example, two instances of an input/output logic element IOL 215 in addition to one instance of the programmable interconnect element INT 211.

As will be clear to those of skill in the art, the actual I/O pads connected, for example, to the I/O logic element 215 are manufactured using metal layers above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 may span several columns of CLBs and BRAMs.

Note that FIG. 2 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 202, 203, 204, and 206 are purely exemplary. For example, in an actual FPGA more than one adjacent column of CLBs is typically included wherever the CLBs appear, to facilitate the efficient implementation of user logic.

Figure 3:
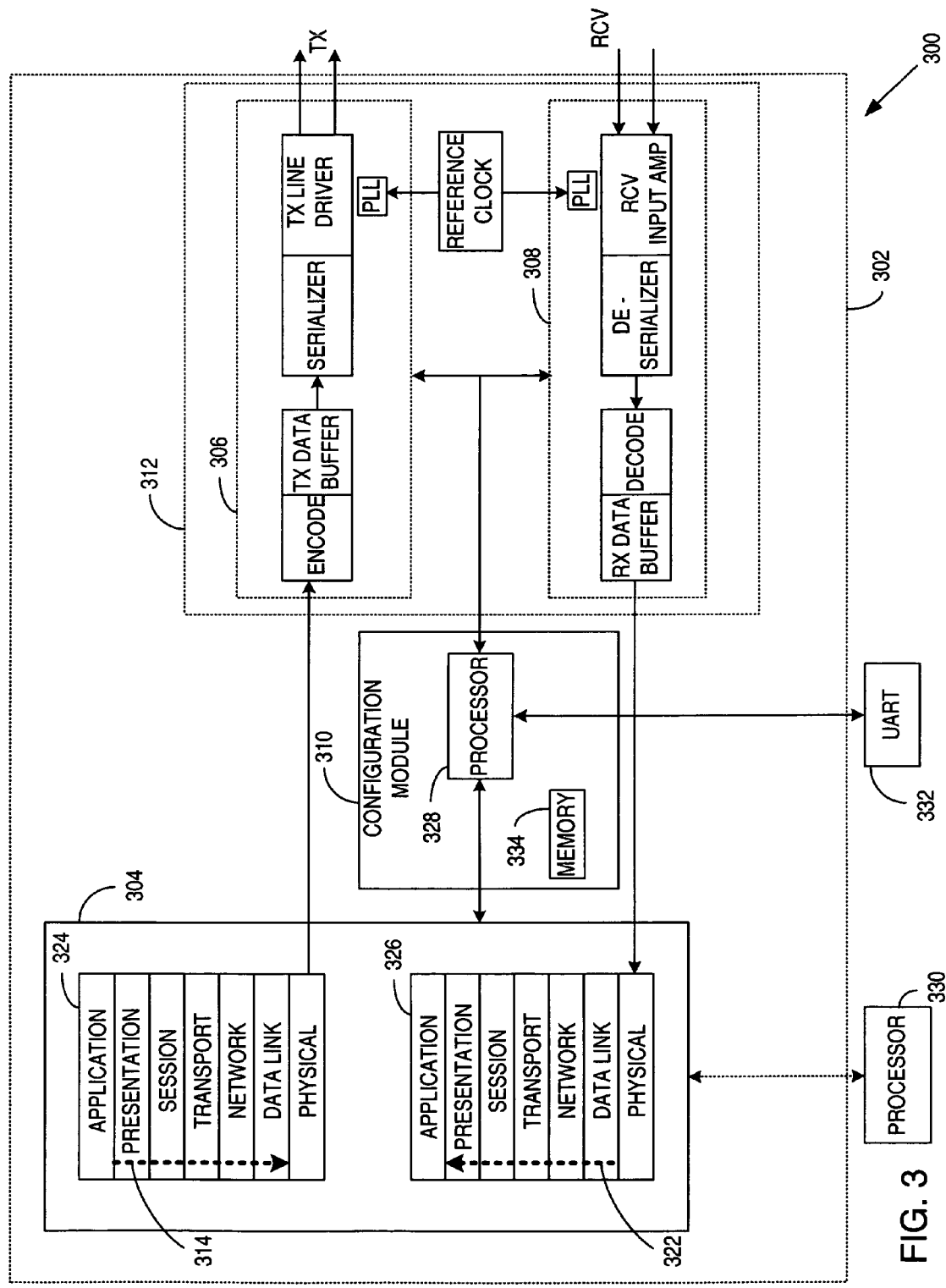
FIG. 3 illustrates an exemplary Field Programmable Gate Array (FPGA) facilitated, single-port communication application in accordance with one embodiment of the present invention.

Turning to FIG. 3, exemplary block diagram 300 in accordance with one embodiment of the present invention is illustrated in which FPGA 302 conducts serial communications with external communications equipment (not shown) using a single channel or port. Distributed between programmable logic resources 304, processor 328, memory 334, and/or external processor 330, communication stacks 324 and 326 may be associated with virtually any number of serial communication protocols operating in conformance with OSI layers, for example, 314 and 322. Communication stacks 324 and 326 are operated to support virtually any serial communications being conducted by transmitter 306 and receiver 308 of serial I/O device 312. Serial I/O device 312 may, for example, be implemented by a single MGT 201 as illustrated in FIG. 2.

In accordance with one embodiment of the present invention, configuration module 310 allows a single MGT 312 and a portion of programmable logic resources 304 to be dynamically reconfigured without affecting other portions of the FPGA or other MGT channels. Thus, operation of configuration module 310 allows the reconfiguration and/or upgrade of a particular port, i.e., dynamic port provisioning, which includes both MGT 312 and protocol 324/326 characteristics, without affecting the characteristics of any other communication port operating within the FPGA. It can be seen, therefore, that dynamic port provisioning in accordance with one embodiment of the present invention may be performed within a PLD, such as FPGA 302.

In particular, configuration module 310 embeds processor 328, such that protocol specific code stored within memory block 334 executed within processor 328 may provide a portion of the communication layer functions of communication stacks 324 and 326. Processor 328 may also facilitate access to internal control and status registers (not shown) within MGT 312, as well as to the lower level protocol layers of communications stacks 324 and 326 that may be implemented within programmable logic resources 304. In such an instance, processor 328 has specific access to dynamically provision MGT 312 and communication protocols 324 and 326 without affecting any other port configuration of FPGA 302. The user may provide processor 328 and memory block 334 with the protocol specific code via, for example, terminal control using Universal Asynchronous Receiver/Transmitter (UART) module 332.

Dynamic port provisioning in accordance with one embodiment of the present invention further provides the necessary routing and placement of logic within configurable logic resources 304 to facilitate the current communication protocol of interest, while simultaneously ensuring that subsequent communication protocols may be facilitated within configurable logic resources 304 without disturbing the logic configuration of any other portion of FPGA 302. That is to say, for example, that the initial routing and placement of logic within configurable logic resources 304 reserves an adequate portion of reconfigurable logic resources for implementation of any other communication protocol that may be desired. Thus, only that portion of configurable logic resources 304 that was initially reserved may be used to reconfigure configurable logic resources 304 for dynamic port provisioning in accordance with one embodiment of the present invention. In this way, any other configurable logic resources within FPGA 302 are left undisturbed.

It should be noted, that an external processor 330 may also be utilized to further define the operation of communication protocols 324 and 326. External processor 330, however, is not required and any functions performed by processor 330 may instead be fully performed by processor 328.

As discussed in more detail below, once the appropriate protocol specific code and related configuration attributes are defined within memory 334, automatic reconfiguration of communication stacks 324,326 and MGT 312 may take place. In particular, fairly high level protocol selections may be requested via UART 332, while all of the underlying primitives and core definitions concerning the requested protocol may be automatically facilitated by processor 328.

With Gigabit Ethernet and 10 Gigabit Ethernet technology increasingly gaining interest, the serial communications block diagram as exemplified in FIG. 3 represents an attractive alternative to the communications offered, for example, by a parallel Ten Bit Interface (TBI). Serial block diagram 300 may, for example, represent a 10 Gigabit Attachment Unit Interface (XAUI), which not only drastically reduces the pin count as compared to the parallel interface counterparts, but trace routing is also simplified since no parallel traces requiring equidistant runs are necessary.

In one embodiment, dynamic port provisioning is performed to define/change communication protocols 324 and 326 that are distributed between a portion of programmable logic resources 304, processor 328 and/or external processor 330. That is to say, for example, that defining/changing protocol characteristics such as data coding, word alignment characters, channel alignment bonding characters, and data buffer characteristics via configuration module 310 is facilitated. Furthermore, other protocol characteristics may be defined/changed by configuration module 310 to include data rate, electrical characteristics, and out-of-band signalling that may be required by the communication protocol.

In another embodiment, dynamic port provisioning may be facilitated through the modification of MGT 312 attributes via configuration module 310. Such configurable MGT attributes (such as can be found, for example, in the Virtex 4 FPGA from Xilinx, Inc., of San Jose, Calif.) may include, for example, data rate, reference clock selection, Phase-Locked Loop (PLL) characteristics, transmitted signal amplitude and common-mode characteristics, transmitter 306 equalization, receiver 308 equalization, and output data alignment. Equalization definitions may include, for example, finite impulse response (FIR) coefficients corresponding to the channel impulse response characteristics as measured/projected by a channel estimation block (not shown).

Each of the configurable MGT attributes are effective to configure, for example, the reference clock source selection, PLL characteristics, equalization, and data alignment functions as performed by the encoding/decoding, Serializer/Deserializer (SerDes), transmission line driver, receiver input amplifier, and buffering blocks of MGT 312.

The transmission line driver of transmitter 306, for example, may be configured to increase/decrease a transmitted signal amplitude in response to transmitter equalization requirements. Alternatively, the receiver input amplifier of receiver 308 may be configured to increase/decrease gain in accordance with receiver equalization requirements.

Furthermore, PLL characteristics and SerDes functions in both transmitter 306 and receiver 308 may be configured to achieve the appropriate data rates and data alignment as required by their respective data transmit and data receive functions. Internal/external reference clock selection may also be configured to determine the frequency reference for the PLL.

In another embodiment, dynamic port provisioning may be facilitated through a dynamic reconfiguration of a portion of FPGA 304 that may be required by the dynamic port definition or change. In particular, a dynamic change in the routing and placement of logic within configurable logic resources 304 may be required. As discussed above, the re-routing and placement of configurable logic to accommodate the dynamic port provisioning is confined to utilize only those configurable logic resources originally reserved during the initial configuration. Thus, by constricting the re-routing and placement of the configurable logic to lie within the original footprint of configurable logic resources 304 as initially configured, disturbance of other configurable logic resources operating within the FPGA is prohibited.

In another embodiment, dynamic port provisioning may be facilitated through defining/changing a port to accommodate specific media associated with the I/O. That is to say that various optical modules, e.g., plug-in optical modules, may be accommodated by the dynamic port definition/change. Other modules accommodating any number of wired cabling architectures may also be accommodated by the dynamic port definition/change. Accommodations for various mezzanine card functionality, e.g., plug-in mezzanine cards, may also be facilitated by the dynamic port definition/change. Other accommodations to the media, such as adjustment of signal amplitude and/or common-mode voltage and adjustment of the signal equalization at transmitter 306 or receiver 308 may also be facilitated by the dynamic port definition/change.

It should be noted that dynamic port provisioning in accordance with one embodiment of the present invention as it relates to communication protocol provisioning, MGT attribute provisioning, configurable logic resource reconfiguration, media accommodation, etc., may be performed separately, or in any combination, as is required by the particular dynamic port provisioning definition or change that may be required. Thus, any one or all of the dynamically configurable port attributes may be defined/changed on the fly by configuration module 310 to facilitate dynamic port provisioning in accordance with one embodiment of the present invention.

Figure 4:
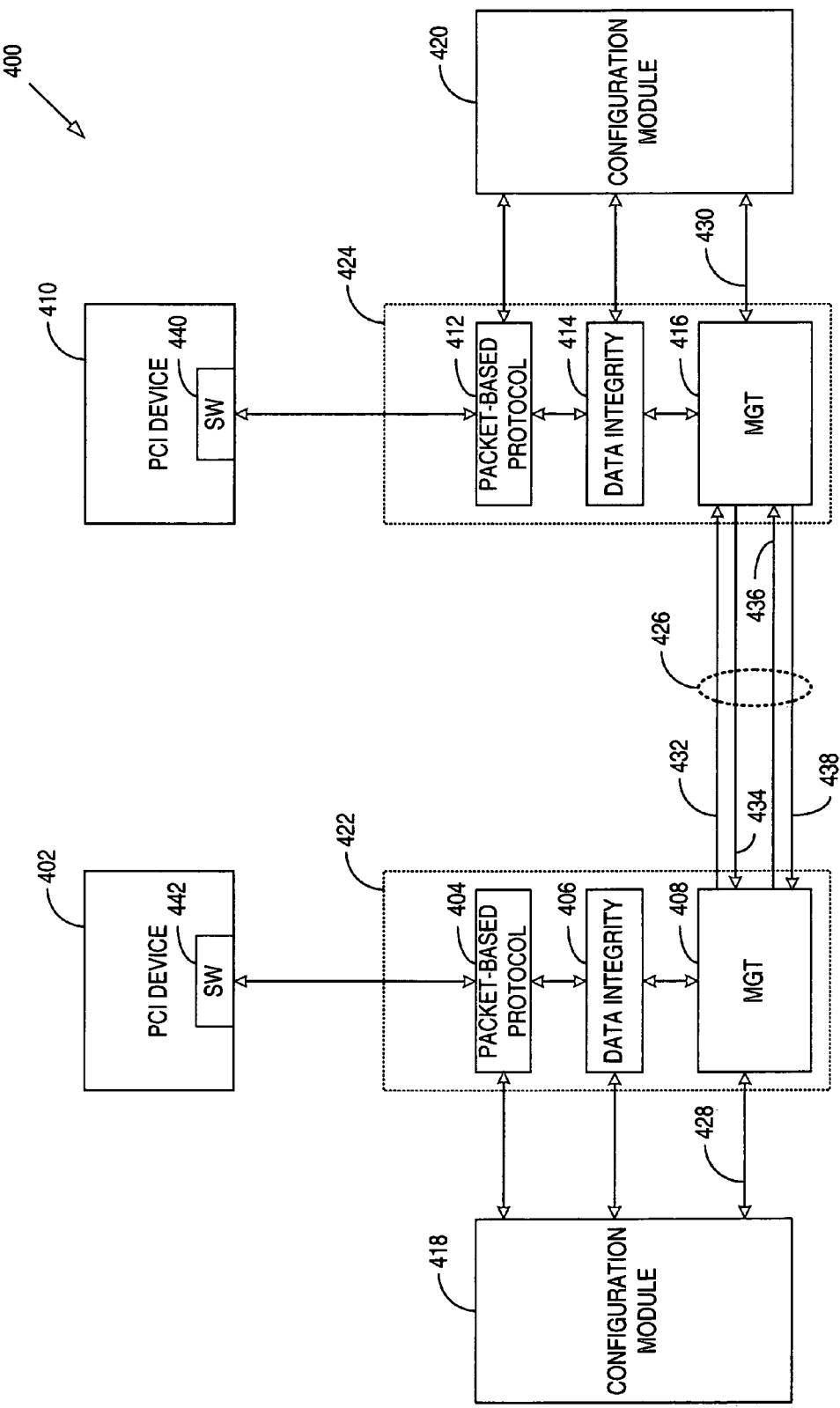
FIG. 4 illustrates an exemplary dynamically configurable communication system in accordance with one embodiment of the present invention.

As discussed above, the present invention may be used in one embodiment to implement communications between PCBs, ICs, and backplanes. Turning to FIG. 4, exemplary block diagram 400 is illustrated in which one embodiment of the present invention may be used, for example, to dynamically configure a PCI express communication link between PCI devices 402 and 410. Although the automated configuration of communication ports and their associated protocols is provided in the context of PCI express in relation to FIG. 4, it is understood that virtually any combination of port/protocol programmability is provided by one embodiment of the present invention. Thus, any specific embodiments are discussed so that an understanding of the present invention may be facilitated rather than to limit the scope of the present invention in any way.

Configurable port/protocol devices 422 and 424 represent FPGA devices in accordance with one embodiment of the present invention, in which MGTs 408 and 416 are configured by configuration modules 418 and 420, respectively, to provide two-way communications via channel 426. In particular, configuration primitives may be downloaded via paths 428 and 430 by respective configuration modules 418 and 420 to control the various Physical Coding Sublayer (PCS) and Physical Medium Attachment (PMA) attributes that are associated with MGTs 408 and 416.

Thus, a fundamental PCI express port may be implemented at channel 426 to provide, for example, a 2.5 Giga-bit per second (Gbps) per direction link using an 8b/10b encoding scheme to allow for an embedded data clock. The link may comprise a dual-simplex channel that is implemented as transmit/receive pairs 432/434 and 436/438.

It is to be understood, that while only a fundamental PCI express link is exemplified in FIG. 4, other PCI express links may be instantiated on the fly in accordance with one embodiment of the present invention to increase the effective bandwidth of the PCI express link. In particular, PCS/PMA primitives may be downloaded to other MGT devices (not shown) by configuration modules 418,420 to add ports having multiple signal pairs similar to the signal pairs established at channel 426. For each port added, channel bonding is facilitated, in which an additional communication lane is bonded to the current communication lane to increase the bandwidth as desired.

While PCS/PMA primitives are used to configure the physical layer of channel 426, configuration modules 418, 420 also provide higher level functions to simultaneously configure data integrity blocks 406, 414, i.e., the data link layer, and packet-based protocol blocks 404, 412, i.e., the transaction layer, for PCI express operation. Data integrity blocks 406, 414 are implemented by the processor (not shown) of configuration modules 418, 420, for example, to insure data integrity by adding a sequence number and a cyclic redundancy check (CRC) residue to each transaction layer packet initiated from packet-based protocol blocks 404, 412. Thus, CRC calculation modules may also be implemented by the processor and associated executable code of configuration modules 418, 420.

In addition, configuration modules 418, 420 may implement data integrity blocks 406, 414 to establish a flow control mechanism, such that packets are only exchanged between PCI devices 402 and 410 when the devices are ready to receive packets, i.e., when their respective receive registers have been vacated to accommodate the new packets. Thus, packet retries are virtually eliminated, whereby packets are re-sent only when the packets are signalled as being corrupted by the receiving end.

In addition, configuration modules 418, 420 may implement packet-based protocol blocks 404, 412 to receive read/write requests from PCI device software blocks 442, 440 and to form request packets in response to the read/write requests for transmission to the data link layer, i.e., data integrity blocks 406, 414. Some of the requests generated by the transaction layer may be implemented by configuration modules 418, 420 to be split transactions, whereby response packets are generated in reply to the read/write requests. Thus, the response packets are received from the data link layer by the transaction layer for subsequent delivery to the correct originator within PCI device software blocks 442, 440.

The PCS/PMA primitives and associated PCI express protocols may be changed via configuration modules 418, 420 on a clock by clock basis. For example, the exemplary PCI express implementation 400 may be initially configured for 2.5 Gbps/direction operation with 8b/10b encoding during initialization/start-up of PCI express channel 426. Once stabilized, channel 426 may be reconfigured at a subsequent clock cycle by the user for 10.3125 Gbps/direction operation with 64b/66b encoding. The corresponding PCI express protocol layers 404, 406 and 412, 414 are also simultaneously configured by configuration modules 418, 420 to incorporate the configuration change as necessary.

Configuration of the FPGA based, PCI express protocols 404,406 and 412,414 may be partially implemented, for example, by changing the contents of the configuration SRAM (not shown) contained within the FPGA by configuration modules 418,420. Such configuration changes may be implemented by the user via Personal Computer (PC) or via specialized Programmable Read-Only Memories (PROM) that contain the various configurations desired by the user.

Figure 5:
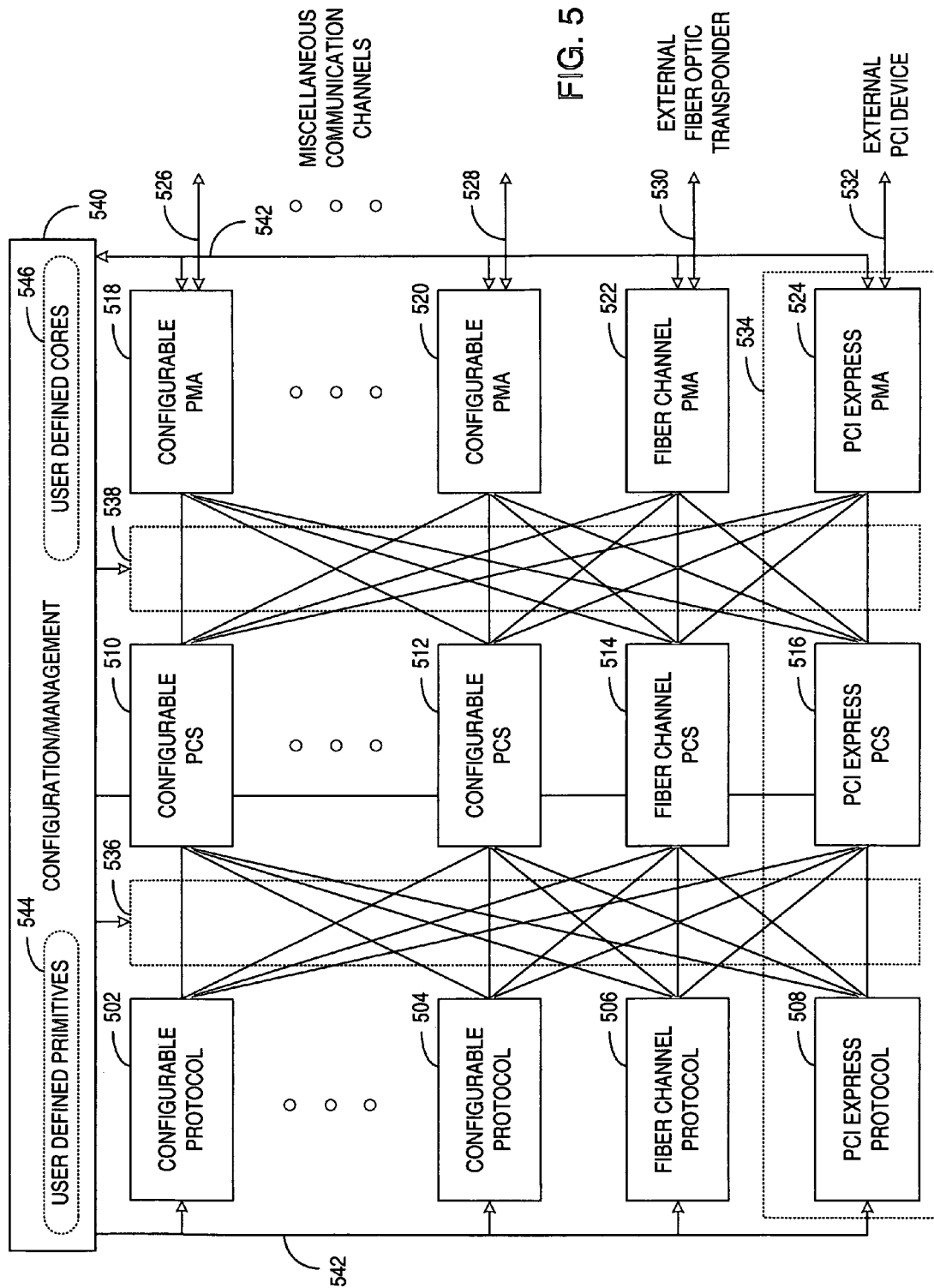
FIG. 5 illustrates a generalized, dynamically configurable communication system in accordance with various embodiments of the present invention.

Abstracting the port/protocol configuration concepts exemplified in FIG. 4, the generic port/protocol block diagram of FIG. 5 may now be exemplified to further demonstrate applications of various embodiments of the present invention. In particular, the port/protocol block diagram of FIG. 5 represents an FPGA implemented, dynamically configured, multi-port communication device in accordance with various embodiments of the present invention.

The communication device comprises multiple configurable protocol blocks 502-508 that are interconnected to configurable PCS blocks 510-516 via interconnect block 536. Configurable PCS blocks 510-516 are then interconnected to configurable PMA blocks 518-524 via interconnect block 538. It can be seen, therefore, that a multitude of interconnect arrangements between configurable PCS/PMA blocks and configurable portions of the programmable logic resources may be established under control of configuration module 540 to dynamically instantiate a plurality of communication ports/protocols from within a single FPGA.

It should be noted that the configurable logic placement and associated signal routing as may be required by each of configurable protocol blocks 502-508 is originally partitioned into optimally sized "footprints" within an appropriate configurable logic resource area of the FPGA. Any subsequent reconfiguration of configurable protocol blocks 502-508 that is needed to accommodate other communication protocols during dynamic port provisioning is guaranteed to be constrained within each optimally sized footprint. Thus, disturbance of any unaffected portions of the configurable logic resources of the FPGA is prohibited during the reconfiguration of one or more configurable protocol blocks that may be required during the dynamic port provisioning.

For example, PCI express block 534 may be instantiated on the fly by configuration module 540 as discussed above in relation to FIG. 4. Configuration bus 542 is used to download the pertinent PCI express attributes, as defined by user defined primitives 544, to set the appropriate PCI express PMA 524 attributes, such as data rate, reference clock, etc.

The appropriate PCI express PCS 516 attributes may also be configured as required for proper PCI express operation. Such attributes may include, for example, lane appropriation, whereby multiple PMAs, e.g., configurable PMAs 518-520, may be combined to create multiple communication lanes to increase throughput. As such, the physical layer is divided among several PMAs and cross-connected via interconnect block 538. The resulting byte stream is then assembled as defined by PCI express PCS block 516 for subsequent transmission to PCI express protocol block 508. Conversely, byte streams received from PCI express protocol block 508 are disassembled as defined by PCI express PCS block 516 and parsed into their corresponding lanes for subsequent transfer by the associated PMAs.

PCI express protocol block 508 may be similarly configured by the user via configuration module 540, where configuration module 540 is similar to configuration module 310 of FIG. 3. In particular, user defined cores 546 may be used to dynamically configure configurable protocol block 508, which may be distributed between internal/external processors and a portion of the programmable logic resources of the FPGA, to operate as a PCI express core.

In addition, code in support of the PCI express protocol may be optionally executed within on-board processor 328 and/or processor 330 to facilitate any higher level protocol operations that may need to be performed. Thus, in order to obtain the protocol functionality desired, code may optionally be distributed between memory 334, processor 328, and/or processor 330 and executed accordingly. PCI express core may then function in accordance with the data link and transaction layer PCI express protocols as discussed above in relation to FIG. 4.

Adjacent to port 532, port 530 may have been initially configured to operate as a PCI express communication port as well. During a dynamic port provisioning event, however, a configuration change may be desired in which port 530 ceases to operate as a PCI express interface in order to commence operation, for example, as a Fiber Channel compliant communication channel operating in conformance with 10 Gigabit Ethernet standards as defined by IEEE 802.3ae. Accordingly, Fiber Channel protocol 506 and Fiber Channel (FC) PCS/PMA 514/522 primitives, as defined by user defined primitives 544, are downloaded/executed by configuration module 540 to implement appropriate Fiber Channel FC-1 layer protocol configuration, such as 8b/10b encoding, comma separated bit patterns for word alignment and detection of special FC words.

Additional FC protocol 506 functionality may be established on the fly via configuration module 540, through execution of an FC core configuration as defined by user defined cores 546. For example, Fiber Channel FC-2 functionality such as Start-of-Frame and End-of-Frame delineation of the payload and CRC portions of the Fiber Channel frame may be established by the Fiber Channel core executables.

As discussed above, any placement of configurable logic and associated routing within configurable protocol block 506 that is needed to accommodate the change from the PCI express protocol to the Fiber Channel protocol during the dynamic port reprovisioning, is guaranteed to be constrained within the optimally sized footprint initially created. Thus, configuration protocol blocks 502-504, 508, and any other configurable logic resources within the FPGA of FIG. 5 remain activated and undisturbed during the dynamic reprovisioning of configurable protocol block 506. Thus, the FPGA of FIG. 5 may continue to service communication ports 526-528, and 532 according to their associated communication protocols, while communication port 530 is deactivated and dynamically reprovisioned in accordance with one embodiment of the present invention.

The Fiber Channel core download may also support, for example, a Management Data Input/Output (MDIO) serial management interface. Such an interface is capable of allowing management module 540 to access the IEEE 802.3ae-2002 clause 45 management registers to facilitate operational state queries of pertinent PHY devices.

As discussed above, the various embodiments of the present invention are not limited to any particular PCS/PMA primitive definition or associated communication protocol. As such, other ports 526-528 are independently defined and configured for operation in accordance with user defined primitives 544 and user defined cores 546 to implement the miscellaneous communication channels on ports 526-528. Such miscellaneous communication channels may include, for example, a 10 Gigabit Attachment Unit Interface (XAUI) with appropriate PCS/PMA primitive downloads to create a 4-lane serial interface using configurable PMA blocks 518-520 with XGMII Extender Sublayers (DTE and PHY XGXS) and the 10GBASE-X sublayer protocol support within configurable protocol block 504.

Figure 6:
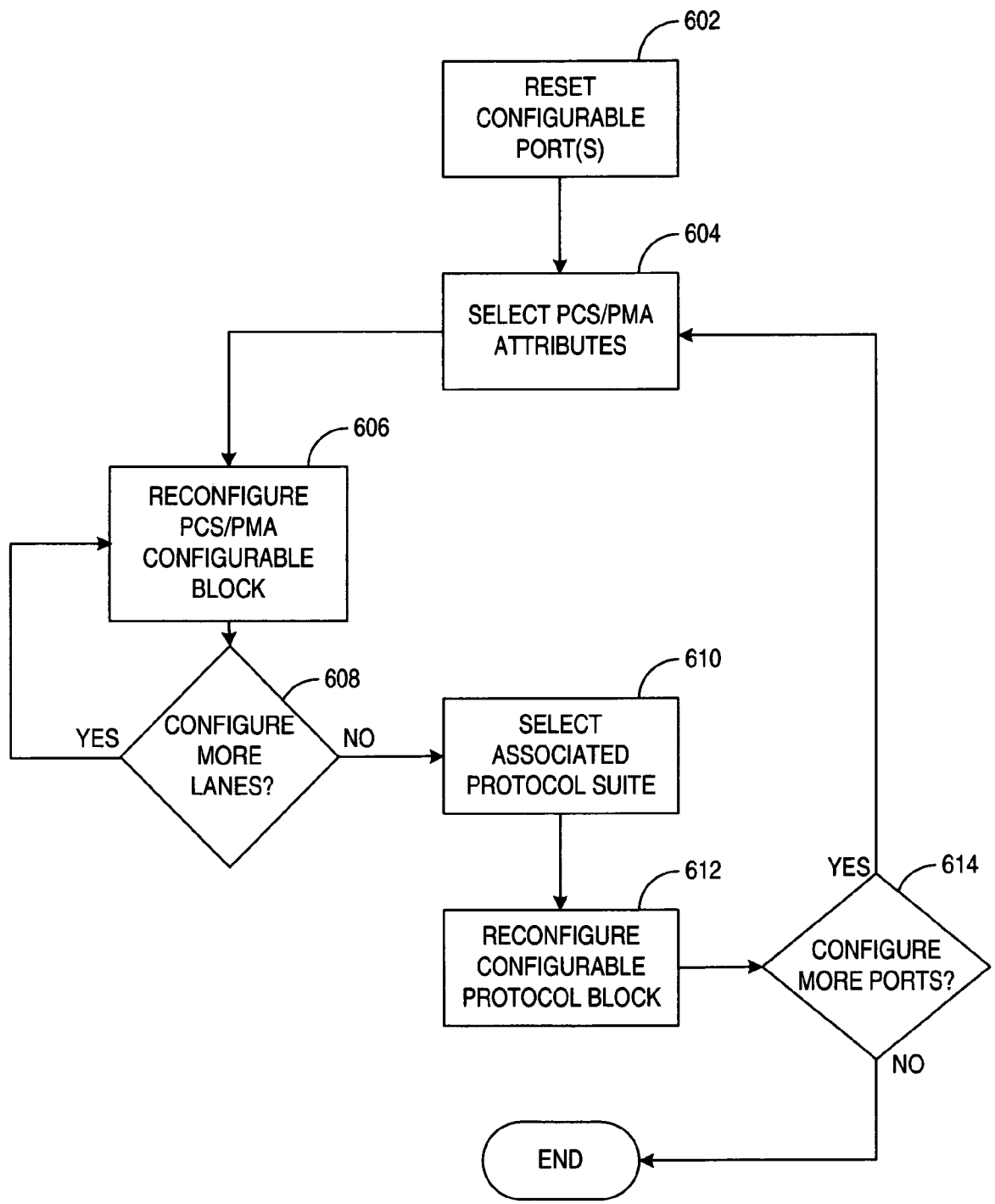
FIG. 6 illustrates an exemplary flow diagram of a method in accordance with various embodiments of the present invention.

As can be seen, therefore, a virtually unlimited number of communication ports and associated protocols may be configured on the fly by the user via configuration module 540. In accordance with various embodiments of the present invention, therefore, the flow diagram of FIG. 6 exemplifies a method that may be used by a user to dynamically instantiate a plurality of communication ports/protocols from within a single FPGA.

Control begins with deactivating operations and reset of the applicable communication ports that are to be defined/ changed as in step 602. Since each port may be independently programmed, each port that is to be configured is to be reset as in step 602. The user may initiate control over the communication ports, for example, via terminal control using a UART interface as exemplified in FIG. 3.

Resetting the applicable communication port(s) involves, in part, an optimal resource allocation definition for each configurable logic resource region that is to be used to partially implement the communication port. That is to say, for example, that sufficient configurable logic resources are reserved to support the initial communication port configuration, so that any subsequent reconfigurations may also be accommodated.

Selection of the appropriate PCS/PMA primitives is then facilitated in step 604 and downloaded to the appropriate PCS/PMA block as in step 606. If a multi-lane implementation is desired, then the appropriate PMAs are selected, configured, and combined as necessary as in steps 606 and 608. Appropriate interconnection control is also facilitated automatically as required by the particular configuration.

Depending upon the PCS/PMA mode that is selected, the user may be confined to a subset of communication protocol configurations that are compatible with the selected PCS/PMA mode. The user may then select from the subset, one of the communication protocol configurations in step 610 that is deemed to be compatible with the selected PCS/PMA mode. Appropriate protocol specific functions may then be implemented through an appropriate core configuration download into the portion of the programmable logic resources that are selected to implement the communication protocol as in step 612, as well as any code execution that is required by the communication protocol, which may be performed by onboard/off-board processing. If other ports within the FPGA are to be configured as determined in step 614, then the configuration process repeats at step 604. Once configured/ reconfigured, the communications port may be activated for operations.

The various embodiments of the present invention are believed to be applicable in a variety of applications. Although a limited number of embodiments contemplated by the present invention have been disclosed, one of ordinary skill in the art will recognize relevant application, for example, with virtually any communication protocol that is capable of hardware implementation for wired and/or wireless applications.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of provisioning communication ports in a programmable device, the method comprising:

initially configuring a plurality of multi-gigabit transceivers (MGTs) and corresponding sets of configurable resources to implement one or more communication protocols;

activating communications with the plurality of MGTs in accordance with the one or more communication protocols;

deactivating one of the plurality of MGTs, wherein at least one MGT attribute is reconfigured relative to the initial MGT configuration; and reconfiguring the set of configurable resources corresponding to the deactivated MGT while continuing communications with the activated MGTs, wherein the reconfiguring the at least one MGT attribute includes changing a data coding format used to encode data prior to transmission and changing data alignment characters used to separate the data to be transmitted.

2. The method of claim 1, wherein reconfiguring the set of configurable resources comprises limiting the configurable resources available for use during the reconfiguration to the configurable resources allocated to the set of configurable resources corresponding to the reconfigured MGT during initial configuration.

3. The method of claim 1, further comprising programming a processor within the programmable device to implement a portion of the one or more communication protocols.

4. The method of claim 1, further comprising programming a processor external to the programmable device to implement a portion of the one or more communication protocols.

5. The method of claim 1, further comprising interconnecting the plurality of MGTs and the corresponding sets of configurable resources in accordance with the one or more communication protocols.

6. The method of claim 5, further comprising combining at least two of the plurality of MGTs to increase bandwidth of the communication port.

7. The method according to claim 1, wherein reconfiguring the at least one MGT attribute comprises:

changing a transmission data rate and a reception data rate of the MGT;

changing a reference clock source selection used to establish the transmission data rate and the reception data rate; and changing Phase-Locked Loop (PLL) characteristics associated with the reference clock source selection.

8. The method according to claim 7, wherein reconfiguring the at least one MGT attribute further comprises:

changing a transmission signal amplitude of differential data to be transmitted by the MGT; and changing a common-mode voltage amplitude for the differential data.

9. The method according to claim 8, wherein reconfiguring the at least one MGT attribute further comprises:

changing transmitter equalization parameters to be applied to the differential data prior to transmission; and changing receiver equalization parameters to be applied to differential data subsequent to reception.

10. The method according to claim 1, wherein reconfiguring the configurable resources corresponding to the deactivated MGT comprises defining communication protocol characteristics associated with data blocks processed by the one or more communication protocols.

11. The method according to claim 10, wherein defining the communication protocol characteristics comprises:

defining cyclic redundancy check (CRC) block parameters for residue calculation on each data block to ensure data integrity for each data block; and defining a flow control mechanism to control transmission of each data block.

12. A method of activating multiple communication ports of an integrated circuit (IC), the method comprising:

configuring a multi-gigabit transceiver (MGT) and an associated set of reconfigurable logic resources associated with each communication port of the IC;

establishing communications with each communication port of the IC, wherein each communication port is configured in accordance with a communication protocol; and reconfiguring one of the communication ports while maintaining each of the other communication ports in an active communication state, wherein the reconfiguring includes changing a data coding format used to encode data prior to transmission and changing data alignment characters used to separate the data to be transmitted.

13. The method of claim 12, wherein reconfiguring one of the communication ports comprises:

reconfiguring an MGT associated with the reconfigured communication port;

identifying reconfigurable logic resources associated with the reconfigured MGT; and reconfiguring only those reconfigurable logic resources identified as being associated with the reconfigured MGT.

14. The method of claim 13, wherein reconfiguring the MGT comprises reconfiguring physical medium attachment (PMA) attributes associated with the MGT.

15. The method according to claim 14, wherein reconfiguring the PMA attributes comprises:

reconfiguring a transmission data rate and a reception data rate of the MGT;

reconfiguring a reference clock source selection used to establish the transmission data rate and the reception data rate; and reconfiguring Phase-Locked Loop (PLL) characteristics associated with the reference clock source selection.

16. The method according to claim 15, wherein reconfiguring the PMA attributes further comprises:

reconfiguring a transmission signal amplitude of differential data to be transmitted by the MGT; and reconfiguring a common-mode voltage amplitude for the differential data.

17. The method according to claim 16, wherein reconfiguring the PMA attributes further comprises:

reconfiguring transmitter equalization parameters to be applied to the differential data prior to transmission; and reconfiguring receiver equalization parameters to be applied to differential data subsequent to reception.

18. The method according to claim 12, wherein establishing communications with each communication port of the IC comprises programming a processor internal to the IC to execute a portion of the communication protocol.

19. The method according to claim 12, wherein establishing communications with each communication port of the IC comprises programming a processor external to the IC to execute a portion of the communication protocol.

* * * * *

UNITED STATES PATENT AND TRADEMARK OFFICE
CERTIFICATE OF CORRECTION

PATENT NO. : 7,598,768 B1  Page 1 of 1
APPLICATION NO. : 11/198576
DATED : October 6, 2009
INVENTOR(S) : Tetzlaff et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1055 days.

Signed and Sealed this

Twenty-eighth Day of September, 2010

David J. Kappos
*Director of the United States Patent and Trademark Office*